(12) United States Patent
Kokubun et al.

(10) Patent No.: US 10,090,860 B2
(45) Date of Patent: Oct. 2, 2018

(54) MEMORY SYSTEM USING INTEGRATED PARALLEL INTERLEAVED CONCATENATION

(71) Applicant: Toshiba Memory Corporation, Minato-ku, Tokyo (JP)

(72) Inventors: Naoaki Kokubun, Fujisawa Kanagawa (JP); Hironori Uchikawa, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 87 days.

(21) Appl. No.: 15/244,412

(22) Filed: Aug. 23, 2016

(65) Prior Publication Data

US 2017/0214415 A1     Jul. 27, 2017

Related U.S. Application Data

(60) Provisional application No. 62/281,790, filed on Jan. 22, 2016.

(51) Int. Cl.
| | | |
|---|---|---|
| *H03M 13/00* | (2006.01) | |
| *H03M 13/29* | (2006.01) | |
| *G06F 11/10* | (2006.01) | |
| *H03M 13/27* | (2006.01) | |
| *G11C 29/52* | (2006.01) | |

(52) U.S. Cl.
CPC ..... *H03M 13/2906* (2013.01); *G06F 11/1068* (2013.01); *H03M 13/2792* (2013.01); *G11C 29/52* (2013.01)

(58) Field of Classification Search
CPC .. G06F 11/1004; H03M 13/09; H03M 13/154
See application file for complete search history.

(56) References Cited

U.S. PATENT DOCUMENTS

| | | | |
|---|---|---|---|
| 5,946,328 A | 8/1999 | Cox et al. | |
| 8,035,909 B2 | 10/2011 | Kuznetsov | |
| 2006/0156171 A1* | 7/2006 | Kuznetsov | G11B 20/1866 714/755 |
| 2012/0192028 A1 | 7/2012 | Allpress et al. | |
| 2013/0139023 A1* | 5/2013 | Han | G11B 20/1833 714/752 |

FOREIGN PATENT DOCUMENTS

JP         2004-348824 A     12/2004

* cited by examiner

*Primary Examiner* — Guy Lamarre
(74) *Attorney, Agent, or Firm* — White & Case LLP

(57) ABSTRACT

A memory controller 2 of a memory system 1 according to an embodiment is provided with an encoding device 10 and a memory interface 5. The encoding device 10 is provided with an encoder 15 which generates a plurality of first parities by encoding a plurality of user data by using a common code, an interleaver 111 which sequentially interleaves the plurality of user data, and an XOR accumulator 112 which sequentially executes component-wise modulo-2 operation on the interleaved plurality of user data. The encoder 15 generates second parity by encoding a result finally obtained by executing the component-wise modulo-2 operation on a plurality of user data. The memory interface 5 writes a code word sequence including the plurality of user data, the first parities and the second parity in a non-volatile memory 9.

14 Claims, 9 Drawing Sheets

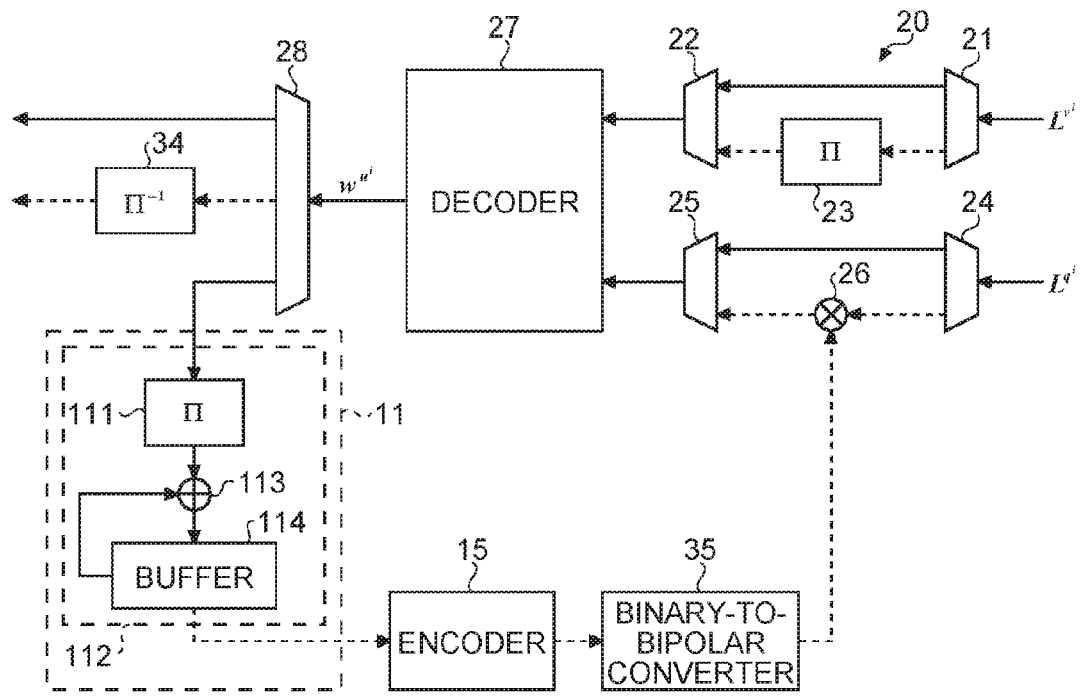
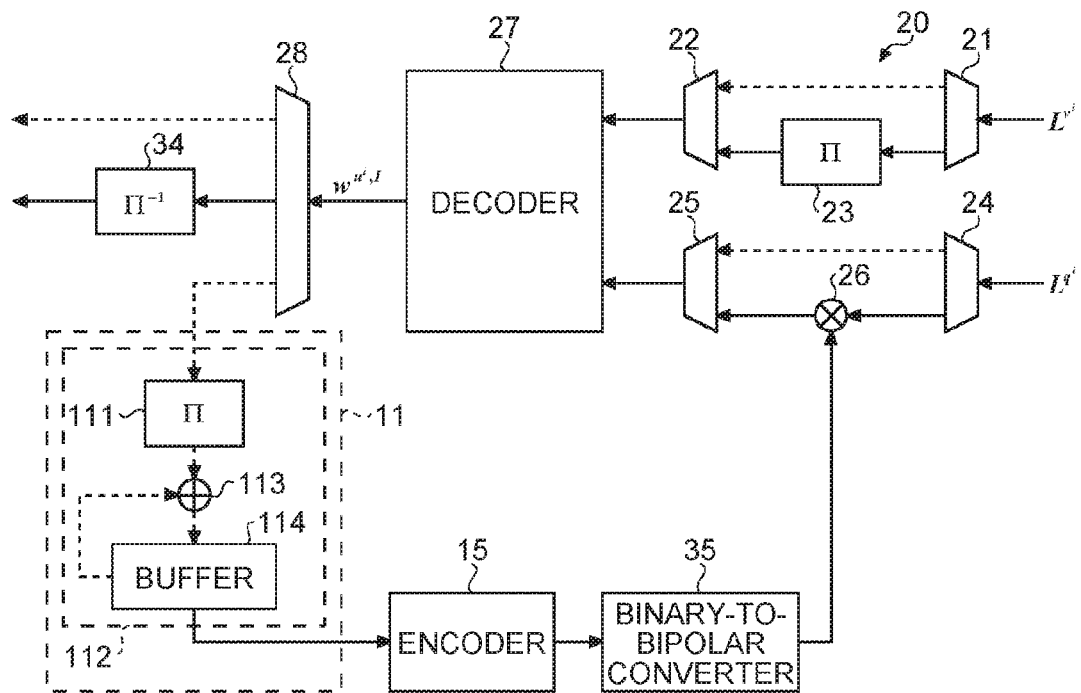

$$\begin{bmatrix} (1) & (2) & (3) & (4) \\ (2) & (1) & (4) & (3) \end{bmatrix}$$

MEMORY SYSTEM USING INTEGRATED PARALLEL INTERLEAVED CONCATENATION

CROSS-REFERENCE TO RELATED APPLICATIONS

This application is based upon and claims the benefit of priority from U.S. Provisional Application No. 62/281,790, filed on Jan. 22, 2016; the entire contents of which are incorporated herein by reference.

FIELD

An embodiment relates generally to a memory system using integrated parallel interleaved concatenation.

BACKGROUND

In a field of error correction, a phenomenon that a decreasing rate of an error rate is deteriorated in a high SNR region as compared to a low SNR (signal to noise power ratio) region. This phenomenon is referred to as an error-floor phenomenon. The error-floor phenomenon is a crucial obstacle for many communication systems and memory systems. In general, when two received words have errors completely independent from each other, it is possible to decrease the error rate in an error-floor by automatic repeat request. However, in some systems, an error position of a repeatedly transmitted received word has correlation with the error position of a first received word. In such system, it is difficult to decrease the error rate in the error-floor by the automatic repeat request.

BRIEF DESCRIPTION OF THE DRAWINGS

FIG. 4 is a block diagram illustrating a schematic configuration example of a decoding device for realizing a decoding scheme according to the first embodiment, the block diagram illustrating a flow of data when decoding an ith constituent code word by using the first parity;

FIG. 5 is a block diagram illustrating a schematic configuration example of the decoding device for realizing the decoding scheme according to the first embodiment, the block diagram illustrating the flow of the data when decoding the ith constituent code word by using the second parity after the decoding by using the first parity is entirely finished when the decoding of the ith constituent code word fails due to a trapping set;

DETAILED DESCRIPTION

Figure 1:
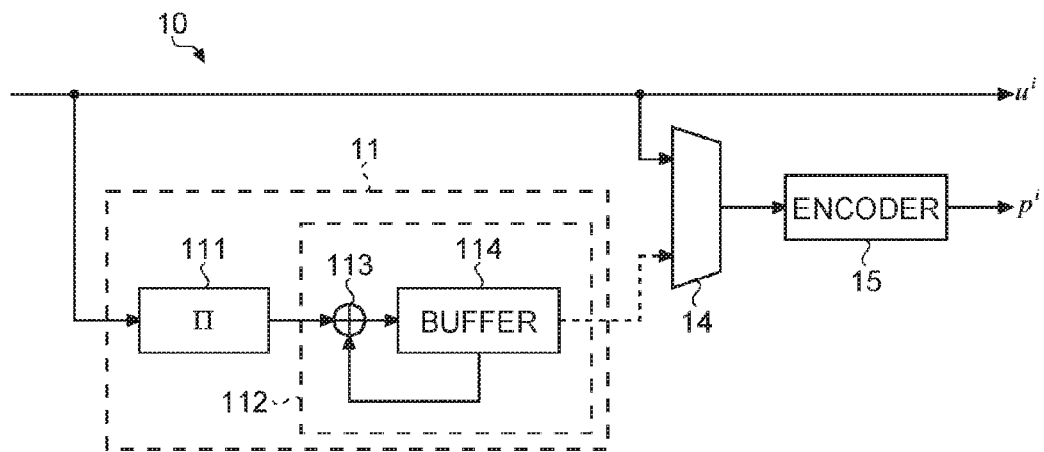
FIG. 1 is a block diagram illustrating a schematic configuration example of an encoding device for realizing an encoding scheme according to a first embodiment, the block diagram illustrating a flow of data when encoding of ith user data $u^i$ and generation of first parity $p^i$ are executed.

According to the following embodiment, provided is a memory system provided with a non-volatile memory; and a memory controller that controls writing in/reading from the non-volatile memory, wherein the memory controller is provided with an encoding device that encodes a plurality of user data to be written in the non-volatile memory, and a memory interface that writes a result of encoding by the encoding device in the non-volatile memory, the encoding device is provided with a first encoder that encodes the plurality of user data to generate first parities of the plurality of user data, a first interleaver that sequentially interleaves the plurality of user data, a first XOR accumulator that sequentially executes bit-wise modulo-2 operation on the plurality of user data sequentially interleaved by the first interleaver, and a second encoder that encodes a result finally obtained by sequentially executing the bit-wise modulo-2 operation by the first XOR accumulator on the plurality of user data interleaved by the first interleaver to generate second parity, and the memory interface writes a code word sequence including the plurality of user data, the first parities and the second parity in the non-volatile memory as a result of the encoding.

In general, in a system in which an error included in a received word is not completely independent from an error in a previous received word or a future received word, a method other than automatic repeat request is considered to be effective in decreasing an error rate in an error-floor. As such method, following three methods (1) to (3) may be exemplified.

(1) Concatenation
(2) Usage of trapping set information
(3) Improved decoding method The methods may also be used in combination with one another. An embodiment belonging to the concatenation of method (1) is hereinafter described as an example.

The concatenation of method (1) relates to a decrease in the error rate in the error-floor and is expected to have a higher effect than other methods (2) and (3) although a loss of a code rate is relatively large. For example, serial concatenation is used in digital video broadcasting (DVB-S2) and the like; a BCH code is suitable for the concatenation as described in an example of the DVB-S2. This is because error bits forming a trapping set are randomly distributed across an entire code in general and the number of error bits is not so large. In addition, the fact that the BCH code has excellent error correcting capability in a high code rate is one of reasons why the BCH code is suitable for the concatenation.

In order to decrease the loss of the code rate and improve the correcting capability, it is effective to encode entire user data by using a long BCH code being an outer code, then divide the entire user data into a plurality of blocks, and encode to protect each block by using an inner code. In such a method, decoding failure probability due to the trapping set is low, so that it is sufficient to consider a case in which decoding of one of a plurality of inner codes fails in almost all the cases. However, this method has a disadvantage that encoding and decoding of the BCH code become complicated because of a long code length as a result of using the long outer BCH code.

Therefore, the following embodiment suggests a memory system designed based on an error correcting scheme in which a small amount of parity generated by using several interleaved code words is used. The small amount of parity generated in the error correcting scheme of this suggestion is referred to as shared parity in the following description.

First Embodiment

According to the error correcting scheme suggested in a first embodiment, ideally, it is possible to decrease the decoding failure probability in an error-floor region to approximately the second power of original probability as in the automatic repeat request. The error correcting scheme of this suggestion also has an advantage that normal operation may be performed even when decoding of one or more constituent codes protected by the shared parity fails due to the trapping set.

This method is the same as integrated interleaving in using the concatenation and modulo-2 addition; however, although the modulo-2 addition is performed on a last constituent code in the integrated interleaving, an additional parity region for the shared parity is secured separate from the constituent codes considering an effect of decreasing the error-floor in this method. Although interleaving to change bit order of the constituent code is not performed in the integrated interleaving, the interleaving to change the bit order of the constituent code is essentially important in this method.

Finally, a point that one code is sufficient for the error correcting scheme of this suggestion although the integrated interleaving requires two or more different codes is one of advantages of the error correcting scheme of this suggestion over the existing integrated interleaving.

(Interleaver)

An interleaver according to the first embodiment is first described. In general, for an LDPC code in which a parallel turbo code and an accumulator are used, the interleaver is expected to improve a minimum distance by locating adjacent bits to bit positions away from one another. On the other hand, this property of extending is not so important for the interleaver of the error correcting scheme according to the first embodiment as is understood from the following study. In the error correcting scheme according to the first embodiment, the interleaver is required to shuffle error vectors so as to avoid being caught by the trapping set. In general, the bit positions regarding the trapping set are randomly distributed across all the code words. Therefore, possibility of escaping from the trapping set by shuffling is not related to a distance between the original position and the position after the shuffling. This suggests that there is a case in which a one-bit cyclic shift interleaver and a short bit length interleaver may be used as the interleaver of the error correcting scheme according to the first embodiment.

However, as for a quasi-cyclic code, there is the same code constraint structure within a range of a block size of the quasi-cyclic code. Therefore, the interleaver according to the first embodiment is preferably not the one-bit cyclic shift interleaver but a one-block size cyclic shift interleaver. As another representative plan, there is a block interleaver which does not change bit order in the block but changes order of blocks. For example, when the number of blocks is five and the block size is three, an example of the block interleaver is as follows.

$$\begin{pmatrix} 1 & 2 & 3 & 4 & 5 & 6 & 7 & 8 & 9 & 10 & 11 & 12 & 13 & 14 & 15 \\ 7 & 8 & 9 & 1 & 2 & 3 & 13 & 14 & 15 & 4 & 5 & 6 & 10 & 11 & 12 \end{pmatrix}$$

Herein, a first row indicates an input index of bits and a second row indicates an interleaver output index. Although such block interleaver maintains the order of bits in the block, a block index is changed by $$\begin{pmatrix} 1 & 2 & 3 & 4 & 5 \\ 3 & 1 & 5 & 2 & 4 \end{pmatrix}$$

in which a first row indicates an input index of the block and a second row indicates an interleaver output index of the block.

(Error Correcting Scheme)

Next, the error correcting scheme according to the first embodiment is described. Meanwhile, a principal object of the first embodiment is to decrease the error rate in the error-floor, so that the following description focuses on a method of encoding and decoding to generate an error-floor phenomenon. In order to clarify the description, systematic encoding is used by using a linear code C characterized by a parity check matrix H.

In the following description, "m", represents the number (positive integer) of code words of the constituent code. The user data being an encoding target of the constituent code are represented as $u^1, u^2, \ldots, u^m$ and parity of each of them is represented as $p^1, p^2, \ldots, p^m$. A superscript i (i is an integer not smaller than one and not larger than m) of each user data $u^i$ indicates the constituent code word. In the following description, each of $p^1, p^2, \ldots, p^m$ is also referred to as first parity.

The parity check matrix H is also represented as $H_U|H_P$. Herein, $H_U$ represents a user data part of H and $H_P$ represents a parity part of H. "|" represents the concatenation of row vectors or matrices having the same row number. Therefore, $u^1, u^2, \ldots, u^m$ are encoded to $u^1|p^1, u^2|p^2, \ldots, u^m|p^m$, respectively, by the encoding by using H.

(Encoding)

In the encoding in the error correcting scheme according to the first embodiment, following equation (1) is first calculated. Herein, "⊕" represents bit-wise modulo-2 addition. In the following description, the bit-wise modulo-2 addition is also referred to as "XOR".

$$u^T = u^1 \oplus u^2 \oplus \ldots \oplus u^m \qquad (1)$$

$u^T$ defined by equation (1) is interleaved according to interleave operation Π. The interleaved $u^T$ is represented as $u^{T,I}$.

$u^{T,J}$ is encoded to $u^{T,J}|p^{T,J}$ according to the parity check matrix H. Herein, $p^{T,J}$ is the shared parity. A code word sequence $\{u^1|p^1, u^2|p^2, \ldots, u^m|p^m, p^{T,J}\}$ obtained by the encoding is output as a result of the encoding in the error correcting scheme according to the first embodiment. That is to say, in the first embodiment, $u^{T,J}$ is not stored but the code word sequence ($\{u^1|p^1, u^2|p^2, \ldots, u^m|p^m, p^{T,J}\}$ formed of the code word sequence $\{u^1|p^1, u^2|p^2, \ldots, u^m|p^m\}$ obtained by the encoding and the shared parity $p^{T,J}$ is output as the result of the encoding to be stored in a predetermined storage region. In the following description, the shared parity is also referred to as second parity for distinguishing the shared parity $p^{T,J}$ from the first parity $p^i$.

Figure 2:
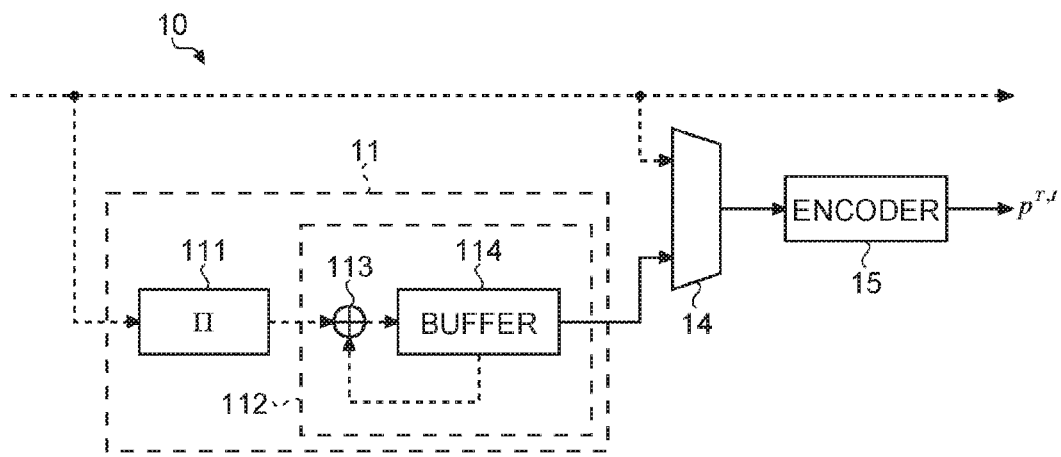
FIG. 2 is a block diagram illustrating the schematic configuration example of the encoding device for realizing the encoding scheme according to the first embodiment, the block diagram illustrating a flow of the data when encoding of a sum $u^{T,J}$ of modulo-2 addition interleaved and generation of second parity $p^{T,J}$ are executed.

FIGS. 1 and 2 are block diagrams illustrating a schematic configuration example of the encoding device for realizing the above-described encoding scheme. FIG. 1 illustrates a flow of data when generation of $p^i$ by encoding $u^i$ is executed and FIG. 2 illustrates a flow of the data when generation of $p^{T,J}$ by encoding $u^{T,J}$ is executed. In FIGS. 1 and 2, a solid line indicates that the data flows and a dotted line indicates that the data does not flow.

As illustrated in FIGS. 1 and 2, an encoding device 10 according to the first embodiment is provided with an interleaved single parity check encoder 11, a multiplexer 14, and an encoder 15. The interleaved single parity check encoder 11 includes an interleaver 111 and an XOR accumulator 112. The XOR accumulator 112 is formed of a bit-wise XOR 113 and a buffer 114. The encoding device 10 is different from a general encoding device in including the interleaver 111 and the buffer 114. The buffer 114 sufficiently has a size at least as large as or larger than a data size of $u^i$.

As illustrated in FIG. 1, the user data $u^1, u^2, \ldots, u^m$ are sequentially output as the user data parts of the systematic encoding to be input to the encoder 15 through the multiplexer 14. The encoder 15 sequentially outputs the first parity $p^1, p^2, \ldots, p^m$ as parity parts of the systematic encoding for the input of the user data $u^1, u^2, \ldots, u^m$.

$u^1, u^2, \ldots, u^m$ are sequentially input to the interleaver 111 to be interleaved for calculating $u^{T,J}$ and input to the XOR accumulator 112.

When describing operation by the XOR accumulator 112 focusing on ith user data $u^i$, $u^i$ is interleaved to be input to the XOR 113 of the XOR accumulator 112. Data stored in the buffer 114 of the XOR accumulator 112 is also input to the XOR 113. Herein, the data stored in the buffer 114 is a result obtained by executing the bit-wise modulo-2 addition on the interleaved $u^1, \ldots, u^{i-1}$. This result is output from the XOR 113 to be stored in the buffer 114. By executing the above-described operation on $u^1$ to $u^m$, the result obtained by executing the bit-wise modulo-2 addition on all the interleaved user data is stored in the buffer 114. Meanwhile, when processing the user data $u^1$ at the top, the result of the modulo-2 addition is not stored in the buffer 114. In this case, it is possible to input a predetermined bit pattern such as '0' with the same data length to the XOR 113 in place of this or store the interleaved $u^1$ in the buffer 114 without processing by the XOR 113.

When $u^{T,J}$ is stored in the buffer 114 in this manner, the data stored in the buffer 114 is input to the encoder 15 through the multiplexer 14 as illustrated in FIG. 2. The encoder 15 executes constituent encoding of the input data to generate the second parity $p^{T,J}$ to output. At that time, the data stored in the buffer 114 is erased.

Figure 3:
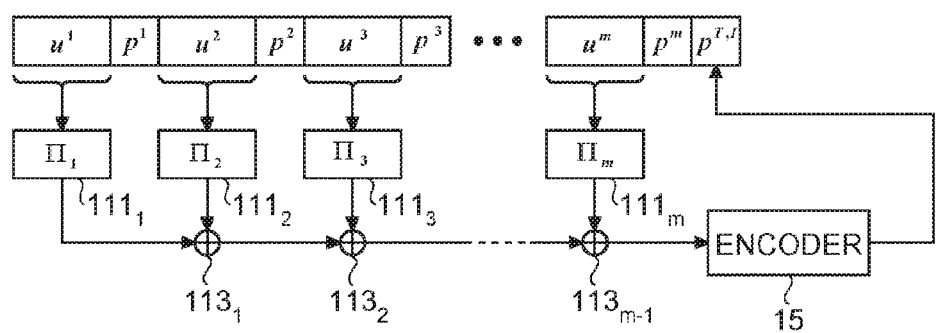
FIG. 3 is a conceptual diagram more simply illustrating the flow of generating the second parity $p^{T,J}$ out of the flow described with reference to FIGS. 1 and 2.

FIG. 3 is a conceptual diagram more simply illustrating a flow of generating $p^{T,J}$ out of the flow described with reference to FIGS. 1 and 2. Meanwhile, although different reference numerals $111_1$ to $111_m$ and $113_1$ to $113_{m-1}$ are assigned to the interleaver 111 for each user data $u^1, u^2, \ldots, u^m$ and the XOR 113 on each stage for clarification in FIG. 3, the interleavers $111_1$ to $111_m$ may be the same interleavers and the XORs $113_1$ and $113_{m-1}$ may be the same XORs.

As illustrated in FIG. 3, a result obtained by interleaving $u^1$ by the interleaver $111_1$ and a result obtained by interleaving $u^2$ by the interleaver $111_2$ are input to the XOR $113_1$ on a first stage and an operation result is input to the XOR $113_2$ on a second stage. A result obtained by interleaving $u^3$ by the interleaver $111_3$ is also input to the XOR $113_2$ on the second stage and a result obtained by interleaving three user data and performing the modulo-2 addition thereon is output. Thereafter, the bit-wise modulo-2 addition is executed on the interleaved $u^i$ and an operation result of the XOR $113_{i-2}$ on a previous stage by the i−1th XOR $113_{i-1}$. An operation result output from the XOR $113_{m-1}$ on a last stage is input to the encoder 15. As a result, the second parity $p^{T,J}$ is output from the encoder 15.

As a result of outputting the user data $u^1, u^2, \ldots, u^m$, the first parity $p^1, p^2, \ldots, p^m$, and the second parity $p^{T,J}$ in the above-described manner, $\{u^1|p^1, u^2|p^2, \ldots, u^m|p^m, p^{T,J}\}$ is stored in a predetermined storage region as a result of final encoding.

Meanwhile, although the interleaver 111 is arranged upstream of the XOR accumulator 112 in FIGS. 1 and 2, the arrangement is not limited thereto and the interleaver 111 may also be arranged downstream of the XOR accumulator 112. However, when the different interleavers $111_1$ to $111_m$ (refer to FIG. 3) correspond to the user data $u^1, u^2, \ldots, u^m$, respectively, the interleaver 111 (refer to FIGS. 1 and 2) should be arranged upstream of the XOR accumulator 112.

(Decoding)

Subsequently, decoding in the error correcting scheme according to the first embodiment is described.

Hereinafter, a case in which the number of decoding failures is one and a case in which this is plural are described by giving examples. Meanwhile, a received word string is represented as $\{v^1|q^1, v^2|q^2, \ldots, v^m|q^m, q^{T,J}\}$ and a corresponding log-likelihood ratio (LLR) string is represented as $\{L^{v^1}|L^{q^1}, L^{v^2}|L^{q^2}, \ldots, L^{v^m}|L^{q^m}, L^{T,J}\}$ in the following description.

In a decoding process in the error correcting scheme according to the first embodiment, the decoding of all the constituent code words is first executed. A log-likelihood ratio (LLR) of a decoded result obtained by this and a hard decision result of the LLR are represented as ($\{L^{u^1}|L^{p^1}, L^{u^2}|L^{p^2}, \ldots, L^{u^m}|L^{p^m}\}$ and $\{w^{u^1}|w^{p^1}, w^{u^2}|w^{p^2}, \ldots, w^{u^m}|w^{p^m}\}$, respectively.

(When there is One Decoding Failure)

Subsequently, a flow of the decoding process when the decoding of one constituent code word fails as a result of the above-described decoding is described. Hereinafter, a case in which the decoding of an ith constituent code word fails as a result of decoding all the constituent code words is described.

When the decoding of one constituent code word fails, prescriptions for the user data including an error which causes the decoding failure are executed. In the prescriptions, following procedures 1 to 5 are executed.

1. First, the bit-wise modulo-2 addition by following equation (2) is executed for m−1 user data $u^1, \ldots, u^{i-1}, u^{i+1}, \ldots, u^m$ which are successfully decoded.

$$u^{T,i} = u^1 \oplus \ldots \oplus u^{i-1} \oplus u^{i+1} \ldots \oplus u^m \qquad (2)$$

2. Next, $u^{T,i}$ is interleaved by the same replacing rule as that of the interleaver 111 in the above-described encoding and a result obtained by the interleaving is encoded by using the same code as that used in the above-described encoding. According to this, third parity $H_P^{-1}H_U\Pi u^{T,i}$ is calculated. Subsequently, binary-to-bipolar conversion to convert bit values 0 and 1 to +1 and −1, respectively, is performed for each bit on $H_P^{-1}H_U\Pi u^{T,i}$. A result thereof is a row vector with a positive or negative parity length and is represented as $s^i$.

3. Next, $L^{T,i} \otimes s^i$ is calculated. Herein, "⊗" represents component-wise multiplication of the row vector.

4. Next, user data $L^{v^j}$ the decoding of which fails in the description above is interleaved by the same replacing rule as that of the interleaver 111 to be made a user data part and the result of the component-wise multiplication in procedure 3 $L^{T,i} \otimes s^i$ is made a parity part to be input to the decoder for decoding the code defined by $H_U|H_P$ to be decoded. When the decoding is successful, interleaved user data $w^{u^i,1}$ is estimated. Meanwhile, a decoded result $L^{u^i}$ for the constituent code or $L^{u^i,A}$ obtained by adjusting by adding or multiplying an adequate constant to or by $L^{u^i}$ may also be used in place of $L^{v^j}$.

5. Next, by executing de-interleaving $\Pi^{-1}$ on $w^{u^i,J}$ estimated in procedure 4, error-corrected user data $u^i$ ($=\Pi^{-1}w^{u^i,J}$) is obtained.

FIGS. 4 and 5 are block diagrams illustrating a schematic configuration example of a decoding device for realizing the above-described decoding scheme. FIG. 4 illustrates a flow of the data when the ith constituent code word is decoded and FIG. 5 illustrates a flow of the data when the ith constituent code word is decoded again by using the second parity when the decoding of the ith constituent code word fails due to the trapping set. In FIGS. 4 and 5, a solid line indicates that the data flows and a dotted line indicates that the data does not flow.

As illustrated in FIGS. 4 and 5, a decoding device 20 according to the first embodiment is provided with de-multiplexers 21, 24, and 28, multiplexers 22 and 25, an interleaver 23, a multiplier 26, a decoder 27, the interleaved single parity encoder 11, the encoder 15, a binary-to-bipolar converter 35, and a de-interleaver 34. The decoding device 20 according to the first embodiment is different from a general decoding device in executing the bit-wise modulo-2 addition. The interleaved single parity check encoder 11 and the encoder 15 of the constituent code may be the same as the interleaved single parity encoder 11 and the encoder 15 illustrated in FIGS. 1 and 2. That is to say, the interleaved single parity check encoder 11 and the encoder 15 may be shared by the encoding device 10 and the decoding device 20.

As illustrated in FIG. 4, when the ith constituent code word is decoded, $L^{v^j}$ and $L^{q^j}$ are input to the decoder 27 through the de-multiplexers 21 and 24 and the multiplexers 22 and 25, respectively. The decoder 27 outputs $w^{u^i}$ by executing the decoding by using the input $L^{v^j}$ and $L^{q^j}$. When the output $w^{u^i}$ is determined to be successfully corrected by the decoder 27, this is output through the de-multiplexer 28 and input to the interleaved single parity encoder 11. In the XOR accumulator 112 of the interleaved single parity encoder 11, the operation similar to the operation described with reference to FIG. 1 above is executed, so that bit-wise modulo-2 operation by using $w^{u^i}$ and a result obtained by executing the bit-wise modulo-2 addition on up to i−1th $w^{u^{i-1}}$ is executed and a result obtained thereby is stored in the buffer 114.

In contrast, the decoding illustrated in FIG. 5 is executed after the decoding illustrated in FIG. 4 is executed on all the constituent code words. When the decoding of the ith constituent code word fails as a result of executing the decoding illustrated in FIG. 4 on all the constituent code words, $L^{v^j}$ interleaved by the interleaver 23 and a result of component-wise multiplication by the multiplier 26 are input to the decoder 27 in order to decode the ith constituent code word by using the second parity as illustrated in FIG. 5. Meanwhile, a result obtained by executing the procedure up to the bit-wise modulo-2 addition on all the outputs from the decoder 27 other than $w^{u^i}$ is stored in the buffer 114. The result stored in the buffer 114 is input to the multiplier 26 after binary-to-bipolar conversion is executed thereon by the binary-to-bipolar converter 35. The multiplier 26 executes the component-wise multiplication of the input result of the binary-to-bipolar conversion by newly input $L^{q^i}$. As a result, the result of the component-wise multiplication by the multiplier 26 is input to the decoder 27 through the multiplexer 25.

The decoder 27 makes the input interleaved $L^{v^j}$ the user data part and makes the result of the component-wise multiplication by the multiplier 26 the parity part and decodes the same by using the same code as that of the encoder 15. As a result, when the decoding is successful, $w^{u^i,J}$ output from the decoder 27 is input to the de-interleaver 34 through the de-multiplexer 28 and the error-corrected user data $u^i$ is obtained from the de-interleaver 34.

Meanwhile, although the interleaver 111 is arranged upstream of the XOR accumulator 112 in FIGS. 4 and 5, when the same interleaver 111 is used for all the constituent code words, the interleaver 111 may also be arranged downstream of the XOR accumulator 112.

Figure 6:
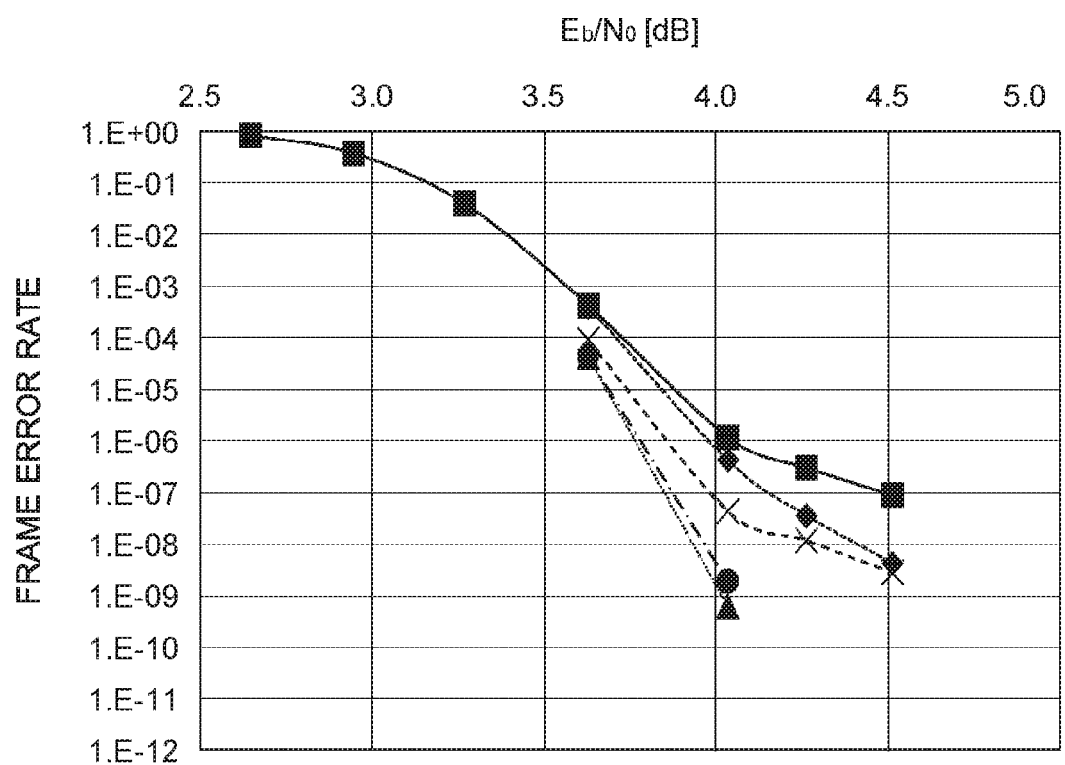
FIG. 6 is a graph indicating a result obtained by simulation executed according to an error correcting scheme according to the first embodiment.

FIG. 6 is a graph indicating a result obtained by simulation executed according to the error correcting scheme according to the first embodiment. In this simulation, a quasi-cyclic IRA code with a code length of 2,592 bits and the code rate of 0.8333 is used as the constituent code, a sum-product algorithm is used for decoding the LDPC code, and 16 constituent codes are protected by the shared parity. In the graph illustrated in FIG. 6, a series of concatenations associated with the BCH code capable of protecting 16 constituent user data and correcting 27 bits by a redundant part having the same size as that of the shared parity are also indicated for comparison.

In the graph illustrated in FIG. 6, a frame error rate (FER) of the constituent code itself is plotted by a black square point. The FER of the concatenation is plotted by a rhombus point. The FER when the interleaver is not used, the FER when a quasi-cyclic shift interleaver to be described later is used, and the FER when a random interleaver with an entire constituent code length is used in the error correcting scheme according to the first embodiment are plotted by a x-mark point, a triangle point, and a circle point, respectively. Meanwhile, in the graph in FIG. 6, in a range in which $E_b/N_0$ on a horizontal axis is larger than 4.2, the values of the FERs of the case in which the quasi-cyclic shift interleaver is used and the case in which the random interleaver with the entire constituent code length is used in the error correcting scheme according to the first embodiment are not plotted; this is because the decoding failure cannot be confirmed in the simulation for the cases in the range in which $E_b/N_0$ on the horizontal axis is larger than 4.2.

As is clear from FIG. 6, the FER is improved in the case in which the quasi-cyclic shift interleaver is used and the case in which the random interleaver with the entire constituent code length is used in the error correcting scheme according to the first embodiment than in other cases. This is considered to be because the error rate in the error-floor is decreased by using the error correcting scheme according to the first embodiment. From this, it may be said that the error rate in the error-floor may be decreased by using the error correcting scheme according to the first embodiment.

When the decoder may be provided with more memories, it is also possible to use the decoder having more powerful $$\begin{pmatrix} H_U & H_P & 0 \\ \Pi H_U & 0 & H_P \end{pmatrix}$$

in place of $H_U|H_P$ as the parity check matrix. In this case, the input to the decoder is $L^{u^i}|L^{p^j}|(L^{T,J}\otimes s^i)$. In such a configuration, the interleaver may be used, so that a logic circuit for a second row block in the parity check matrix may be omitted. However, it is necessary to store a message corresponding to the second row block in the memory of the decoder.

(When there are Plural Decoding Failures)

Subsequently, the following two methods are described about the prescriptions when there is a plurality of decoding failures as a result of the above-described decoding. Although a case in which there are two decoding failures of the constituent code words is described as an example for simplification in the following description, the similar method may also be applied when there are three or more decoding failures unless the number thereof is not so large. Meanwhile, an upper limit of the number of the constituent code words correctable by the error correcting scheme described in the first embodiment depends on the systematic linear code C and the number m of the inner codes.

(First Prescription)

A first prescription is first described. One of advantages of the first prescription is that one interleaver may correspond to m code words. In the first prescription, following procedures 1 to 5 are executed. Hereinafter, a case in which the decoding of ith and jth constituent code words fails as a result of decoding all the constituent code words is described.

1. First, the bit-wise modulo-2 addition by following equation (3) is executed on m−2 user data $u^1, \ldots, u^{i-1}, u^{i+1}, \ldots, u^{j-1}, u^{j+1}, \ldots, u^m$ successfully decoded.

$$u^{T,i,j} = u^1 \oplus \ldots \oplus u^{i-1} \oplus u^{i+1} \ldots \oplus u^{j-1} \oplus u^{j+1} \ldots \oplus u^m \quad (3)$$

2. Next, $u^{T,i,j}$ is interleaved by the same replacing rule as that of the interleaver 111 in the above-described encoding and a result obtained by the interleaving is encoded by using the same code as the code used in the above-described encoding. According to this, third parity $H_P^{-1}H_U\Pi u^{T,i,j}$ is calculated. Subsequently, the bit-wise binary-to-bipolar conversion is executed on $H_P^{-1}H_U\Pi u^{T,i,j}$. As a result, $s^{i,j}$ is obtained.

3. Next, the component-wise multiplication $L^{T,J}\otimes s^{i,j}$ is calculated.

4. Next, $L^{u^i}$ and $L^{u^j}$ the decoding of which fails in the above-description are interleaved by the same replacing rule as that of the interleaver 111. Results $\Pi L^{u^i}$ and $\Pi L^{u^j}$ of the interleaving and the result $L^{T,J}\otimes s^{i,j}$ of the component-wise multiplication in procedure 3 are input to the decoder which uses the code defined by a parity check matrix $H_U|H_U|H_P$. When the decoding is successful, $w^{u^i,J}|w^{u^j,J}$ is estimated. Meanwhile, $\Pi L^{u^i}|\Pi u^j$ or $\Pi L^{u^i,A}|\Pi L^{u^j,A}$ may also be used in place of $\Pi L^{u^i}|\Pi L^{u^j}$.

5. Next, error-corrected user data $u^i (= \Pi^{-1}w^{u^i,J})$ and $u^j (= \Pi^{-1}w^{u^j,J})$ are obtained by executing de-interleaving $\Pi^{-1}$ on $w^{u^i,J}|w^{u^j,J}$ estimated in procedure 4.

When the decoder may be provided with more memories, it is also possible to use the decoder having a more powerful parity check matrix $$\begin{pmatrix} H_U & H_P & 0 & 0 & 0 & 0 \\ 0 & 0 & H_U & H_P & 0 & 0 \\ \Pi & 0 & \Pi & 0 & I & 0 \\ 0 & 0 & 0 & 0 & H_U & H_P \end{pmatrix}$$

in place of $H_U|H_U|H_P$ as the parity check matrix. Herein, "I" is a unit matrix of the same size as the user data. In this case, the input to the decoder is $L^{u^i}|L^{p^j}|L^{u^j}|L^{p^j}|0|(L^{T,J}\otimes s^{i,j})$.

(Second Prescription)

A second prescription is next described. The second prescription has an advantage that an additional memory size is not required although different interleavers are required for each user data. In the second prescription, following procedures 0 to 6 are executed. Hereinafter, a case in which the decoding of the ith and jth constituent code words fails as a result of decoding all the constituent code words is described.

0. First, $u^{I,T}$ is calculated by following equation (4). Herein, the second measure is different from the first prescription in that the interleaving is executed before each bit-wise modulo-2 addition. Then, second parity $p^{I,T}$ is calculated from $u^{I,T}$ by using $H_U|H_P$. Meanwhile, a corresponding LLR is represented by $L^{I,T}$.

$$u^{I,T} = \Pi_1 u^1 \oplus \Pi_2 u^2 \oplus \ldots \oplus \Pi_m u^m \quad (4)$$

1. Next, the bit-wise modulo-2 addition by following equation (5) is executed on m−2 user data $u^1, \ldots, u^{i-1}, u^{i+1}, \ldots, u^{j-1}, u^{j+1}, \ldots, u^m$ successfully decoded. Herein, $u^{I,T,i,j}$ is a sum of interleaved user data except $\Pi_i u^i$ and $\Pi_j u^j$.

$$u^{I,T,i,j} = \Pi_1 u^1 \oplus \ldots \oplus \Pi_{i-1} u^{i-1} \oplus \\ \Pi_{i+1} u^{i+1} \ldots \oplus \Pi_{j-1} u^{j-1} \oplus \Pi_{j+1} u^{j+1} \ldots \oplus \Pi_m u^m \quad (5)$$

2. Next, $u^{I,T,i,j}$ is encoded by using the same code as that used in the above-described encoding. According to this, third parity $H_P^{-1}H_U u^{I,T,i,j}$ is calculated. Subsequently, the bit-wise binary-to-bipolar conversion is executed on the calculated $H_P^{-1}H_U u^{I,T,i,j}$. As a result, $s^{I,i,j}$ is obtained.

3. Next, the component-wise multiplication $L^{I,T}\otimes s^{I,i,j}$ is calculated.

4. Next, $(\Pi_i L^{u^i} \otimes \Pi_j L^{u^j})|(L^{I,T}\otimes s^{I,i,j})$ is input to a $H_U|H_P$ decoder. Herein, "⊞" represents component-wise box-plus operation. For example, the box-plus operation of x and y is defined as $x \boxplus y = \max(0, x+y) - \max(x, y) + \log(1+e^{-|x+y|}) - \log(1+e^{-|x-y|})$. "max" is a function which outputs a larger input argument value the approximation of which is $\text{sign}(x) \cdot \text{sign}(y) \cdot \min(|x|, |y|)$. Herein, $\text{sign}(x) = x/|x|$. "min" is a function which outputs a smaller input argument value. $\Pi_i L^{u^i} \boxplus \Pi_j L^{u^j}$ or $\Pi_i L^{u^i,A} \boxplus \Pi_j L^{u^j,A}$ may also be used in place of $\Pi_i L^{u^i} \boxplus \Pi_j L^{u^j}$.

5. Next, when the decoding in procedure 4 is successful, an estimated word $w^{I,u^i,u^j}$ for the code word obtained by executing the modulo-2 addition on $u^i$ and $u^j$ is obtained, and an error vector $e^{I,u^i,u^j} = w^{I,u^i,u^j} \oplus w^{In}$ is estimated therefrom. Herein, $w^{In}$ is a hard decision result of an input LLR $\Pi_i L^{u^i} \boxplus \Pi_j L^{u^j}$ to the decoder. Subsequently, the bit-wise binary-to-bipolar conversion of $\Pi_i^{-1} e^{I,u^i,u^j}$ is executed and a result thereof is represented as $t^i$.

6. Next, $(L^{u^i}|L^{q^j}) \otimes t^i$ is input to the decoder corresponding to the code defied by $H_U|H_P$ regarding the ith constituent code word, and when the decoding is successful, the error-corrected user data $u^i$ is obtained. Meanwhile, the same also applies to the jth constituent code word.

Herein, additional description is supplied for procedures 4 to 6 in the second prescription. A reason why the box-plus operation is used in procedure 4 is described. When the user data $u^i$ and $u^j$ are independent from each other and a communication path is memoryless, an LLR of $u^i \oplus u^j$ is represented by the box-plus operation of LLRs of $u^i$ and $u^j$. Procedure 4 is the decoding of the code word $u^i \oplus u^j$ by using the shared parity. Since it is supposed that the two user data are independently generated and the communication path is memoryless, the box-plus operation is used for obtaining the input LLR to the decoder. In procedure 5, $\Pi_j^{-1} e^{I,u^i,u^j} = e^{u^i} \oplus \Pi_i^{-1} \Pi_j e^{u^j}$ is calculated. Herein, since $e^{u^i}$ and $e^{u^j}$ are error vectors of $u^i$ and $u^j$, respectively, and the errors causing the decoding failure, they are supposed to be the trapping set. Therefore, when the errors are adequately shuffled by the interleaver $\Pi_i^{-1} \Pi_j$, in procedure 6, $\Pi_j^{-1} e^{I,u^i,u^j} \oplus e^{u^j}$ includes only $\Pi_i^{-1} \Pi_j e^{u^j}$ which is supposed not to be the trapping set.

As described above, according to the error correcting scheme according to the first embodiment, it is possible to decrease the error rate in the error-floor even when the decoding failure occurs in one of a plurality of code words protected by the shared parity (second parity).

According to the error correcting scheme according to the first embodiment, it is possible to decrease the error rate in the error-floor by using an additional memory even when the decoding failure occurs in a plurality of a plurality of code words protected by the shared parity (second parity).

Furthermore, according to the error correcting scheme according to the first embodiment, it is possible to decrease the error rate in the error-floor by changing the method of interleaving in each code word for a plurality of code words even when the decoding failure occurs in a plurality of a plurality of code words protected by the shared parity (second parity).

Furthermore, in the error correcting scheme according to the first embodiment, it is possible to decrease the error rate in the error-floor also by using the interleaver having a simple configuration.

(Memory System)

Subsequently, an example of the memory system on which the encoding device and the decoding device designed based on the error correcting scheme according to the first embodiment are mounted is hereinafter described in detail with reference to the drawings.

Figure 7:
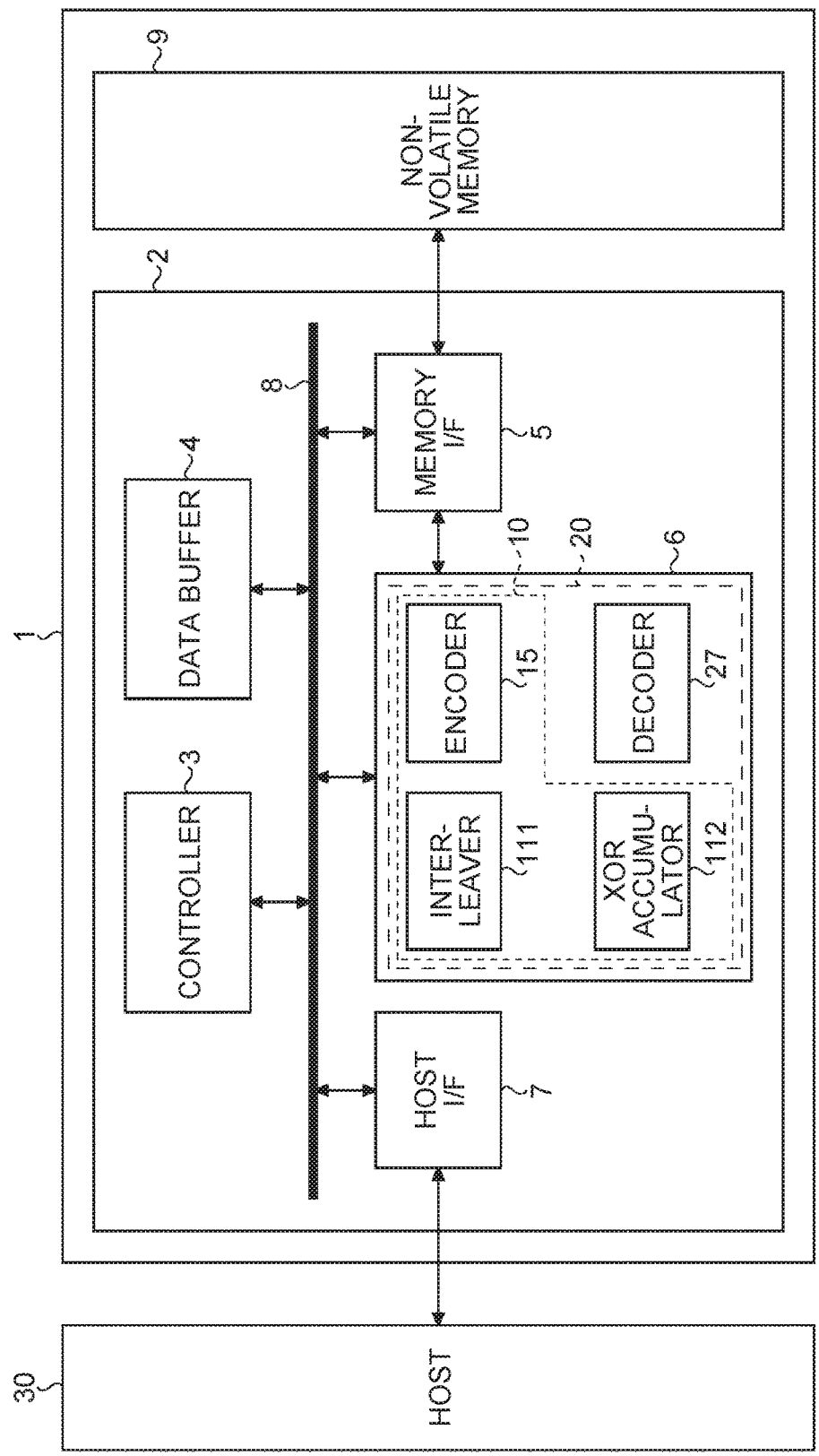
FIG. 7 is a block diagram illustrating a schematic configuration example of a memory system according to the first embodiment.

FIG. 7 is a block diagram illustrating a schematic configuration example of the memory system according to the first embodiment. As illustrated in FIG. 7, a memory system 1 is provided with a memory controller 2 and a non-volatile memory 9.

The non-volatile memory 9 being a storage region in which the data is stored in a non-volatile manner is formed of one or more NAND flash memory, for example. The non-volatile memory other than the NAND flash memory may also be used. In the NAND flash memory, the data is written and read for each write unit data generally referred to as a page.

The memory controller 2 controls writing in the non-volatile memory 9 according to a write command from a host 30. The memory controller 2 controls reading from the non-volatile memory 9 according to a read command from the host 30. The memory controller 2 has a configuration in which a host interface (host I/F) 7, a memory interface (memory I/F) 5, a controller 3, an ECC (error correcting code) unit 6, and a data buffer 4 are connected to one another through an internal bus 8, for example.

The host interface 7 outputs a command received from the host 30, user data (write data) and the like to the internal bus 8. The host interface 7 transmits the user data read from the non-volatile memory 9 and a response from the controller 3 to the host 30. The host 30 may be an electronic device such as a personal computer and a portable terminal, for example.

The memory interface 5 controls a process of writing the user data and the like in the non-volatile memory 9 and a process of reading the data from the non-volatile memory 9 based on an instruction of the controller 3.

The controller 3 generally controls the memory system 1. The controller 3 is a CPU (central processing unit), an MPU (micro processing unit) and the like, for example. When the controller 3 receives the command from the host 30 through the host interface 7, this controls according to the command. For example, the controller 3 instructs the memory interface 5 to write the user data and the parity in the non-volatile memory 9 according to the command from the host 30. The controller 3 instructs the memory interface 5 to read the user data and the parity from the non-volatile memory 9 according to the command from the host 30.

The controller 3 determines a storage region (memory region) on the non-volatile memory 9 for the user data accumulated in the data buffer 4. The user data is stored in the data buffer 4 through the internal bus 8. The controller 3 determines the memory region for the data in a page unit being a writing unit (page data).

In this description, the user data stored in one page of the non-volatile memory 9 is defined as unit data. In the first embodiment, the code word is generated by the above-described encoding by using the unit data and the code word is stored in one page of the non-volatile memory 9 as one page data.

In this description, memory cells commonly connected to one word line are defined as a memory cell group. When the memory cell is a single-level cell, the memory cell group corresponds to one page. When the memory cell is a multi-level cell, the memory cell group corresponds to a plurality of pages. For example, when the multi-level cell capable of storing two bits is used, the memory cell group corresponds to two pages.

The controller 3 determines the memory region of the non-volatile memory 9 being a written destination for each unit data. A physical address is assigned to the memory region of the non-volatile memory 9. The controller 3 manages the memory region being the writing destination of the unit data by using the physical address. The controller 3 instructs the memory interface 5 to write the user data in the non-volatile memory 9 while specifying the determined memory region (physical address).

The controller 3 manages correspondence between a logic address (logic address managed by the host 30) of the user data and the physical address. When receiving the read command including the logic address from the host 30, this specifies the physical address corresponding to the logic address and instructs the memory interface 5 to read the user data while specifying the physical address.

The ECC unit 6 having a configuration for realizing the error correcting scheme according to the above-described first embodiment encodes the unit data stored in the data buffer 4 to generate the code word. The ECC unit 6 includes the encoding device 10 illustrated in FIGS. 1 and 2 and the decoding device 20 illustrated in FIGS. 4 and 5. The encoding device 10 executes the above-described encoding on the unit data written in the same page to generate the constituent code word. The decoding device 20 executes the above-described decoding on the constituent code word read from the non-volatile memory 9 to reproduce the user data.

The data buffer 4 temporarily stores the user data received from the host 30 before storing the same in the non-volatile memory 9. The data buffer 4 temporarily stores the data read from the non-volatile memory 9 before transmitting the same to the host 30. The data buffer 4 is formed of a general-purpose memory such as a SRAM (static random access memory) and a DRAM (dynamic random access memory), for example.

Although a configuration in which the memory controller 2 is provided with the ECC unit 6 and the memory interface 5 separate from each other is illustrated in FIG. 7, the ECC unit 6 may also be incorporated in the memory interface 5.

Meanwhile, a SSD (flash solid state drive) is described above as an example of the memory system 1, the system is not limited thereto. For example, the error correcting scheme according to the above-described first embodiment may be applied to a system in which the error-floor phenomenon might occur such as a cSSD (client SSD) card and an eSSD (enterprise SSD).

Second Embodiment

In the error correcting scheme in the integrated parallel interleaved concatenation illustrated in the first embodiment, the generated code word is formed of a plurality of constituent codes and the shared parity common to all the constituent codes, and after the decoding (hereinafter, referred to as first-stage decoding) by using the first parities $p^1, p^2, \ldots, p^m$ generated for the user data $u^1, u^2, \ldots, u^m$, respectively, is executed, the decoding (hereinafter, referred to as second-stage decoding) by using the shared parity $p^{T,J}$ being the second parity is executed as needed. Therefore, in the first embodiment, when the decoding of at least one constituent code is unsuccessful as a result of decoding each constituent code in the first-stage decoding, the shared parity is appropriately corrected and the second-stage decoding is executed by using the corrected shared parity.

In order to realize the second-stage decoding by using the shared parity, an interleaver for shuffling error vectors so as to avoid being caught by a trapping set is required as described above. For example, when a decoding device 20 mounted on a memory controller of a NAND flash memory adopts a QC (quasi-cyclic)-LDPC code, an effect sufficient for decreasing an error rate in an error-floor may be obtained by using the interleaver which changes order of a circulant matrix. This means that the decoding device 20 used in the first-stage decoding can be reused in the second-stage decoding. Therefore, in the second embodiment, an example of a configuration of reusing the decoding device 20 for the first-stage decoding in the second-stage decoding is described. According to the second embodiment, complexity of the second-stage decoding may be decreased.

When a BP (belief propagation) decoding algorithm is used as a decoding algorithm of binary QC-LDPC decoding, an LLR (log-likelihood ratio) is conveniently used. The LLR is a value defined by $$\ln\left(\frac{P(y|x=0)}{P(y|x=1)}\right)-$$

wherein x represents a value of a transmission bit, y represents a reception value, and P(y|x=0) represents a conditional probability that y is received when x=0 is transmitted.

The decoding device 20 which executes the BP decoding is required to store the LLRs having a length of a code length in a predetermined memory. Check node processing to decode in a row direction of a parity check matrix and variable node processing to decode in a column direction are executed on the stored LLR according to a position of a non-zero portion of a parity check matrix ($H=H_U|H_P$) (hereinafter, simply referred to as the check matrix). Meanwhile, the binary QC-LDPC code is the code having a structure, and the check matrix is the matrix which may be described using a matrix obtained by shifting a unit matrix referred to as the circulant matrix as a unit.

Figure 8:
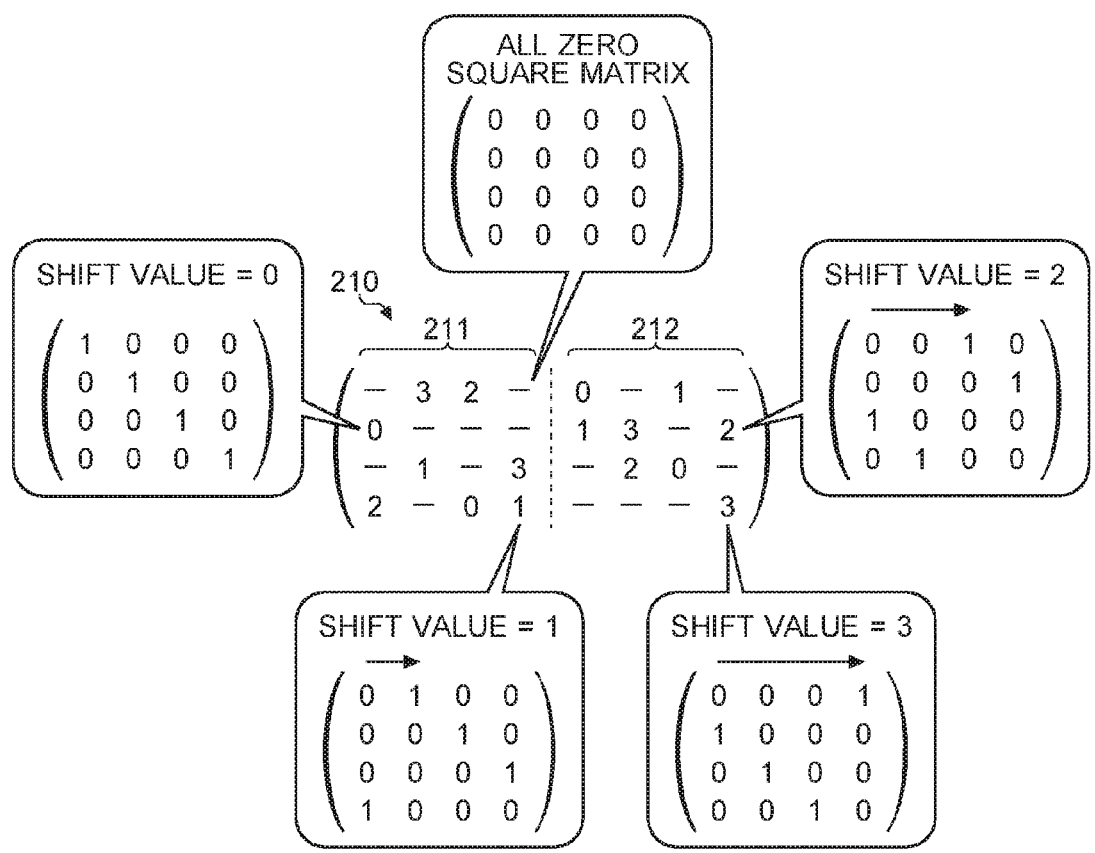
FIG. 8 is a view illustrating a specific example of a parity check matrix represented by a shift value of a circulant matrix having a size of four.

FIG. 8 is a view illustrating a specific example of the check matrix represented by a shift value of the circulant matrix having a size of four. Meanwhile, in FIG. 8, each of numeric values zero to three represents the shift value from the unit matrix and a dash (-) represents an all zero square matrix having a size of the circulant matrix.

A check matrix 210 illustrated in FIG. 8 is formed of four-row blocks by eight-column blocks circulant matrices. The check matrix 210 is formed of 4×8=32 LLRs with a code rate of 0.5. Herein, when each sectioned block obtained when an LLR memory to be described later (refer to an LLR memory 204 in FIG. 9 or 10) is sectioned in units of circulant matrix is defined as an LLR block, if the check code 210 is a systematic code, for example, four LLR blocks on a right side in respective rows of the check matrix 210 represent the parities (corresponding to the first parities $p^1$, $p^2, \ldots, p^m$ generated by an encoder. In the following description, the LLR block forming the parity is referred to as a parity LLR block 212. Four LLR blocks on a left side in respective rows of the matrix represent the user data $u^1$, $u^2, \ldots, u^m$. In the following description, the LLR block forming the user data is referred to as a data LLR block 211.

Figure 9:
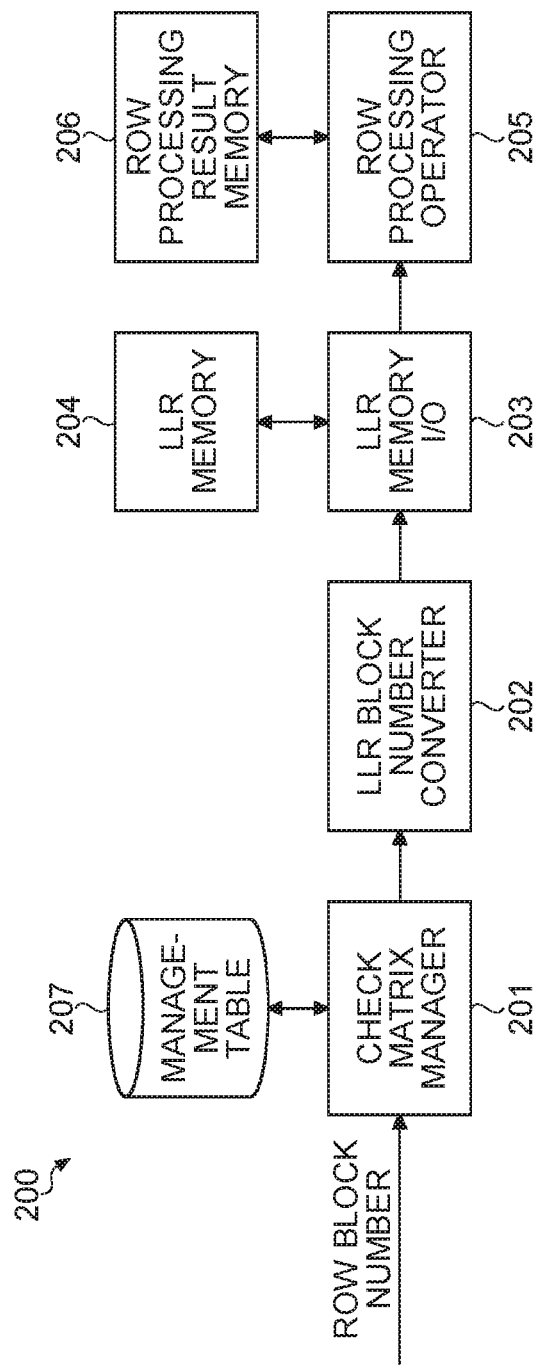
FIG. 9 is a block diagram illustrating a schematic configuration example of a decoder according to a second embodiment.

Subsequently, a decoding device according to the second embodiment is described in detail with reference to the drawings. FIG. 9 is a block diagram illustrating a schematic configuration example of the decoding device according to the second embodiment. As illustrated in FIG. 9, a decoding device 200 according to the second embodiment is provided with a check matrix manager 201, a management table 207, an LLR block number converter 202, an LLR memory I/O 203, an LLR memory 204, a row processing operator 205, and a row processing result memory 206.

Figure 10:
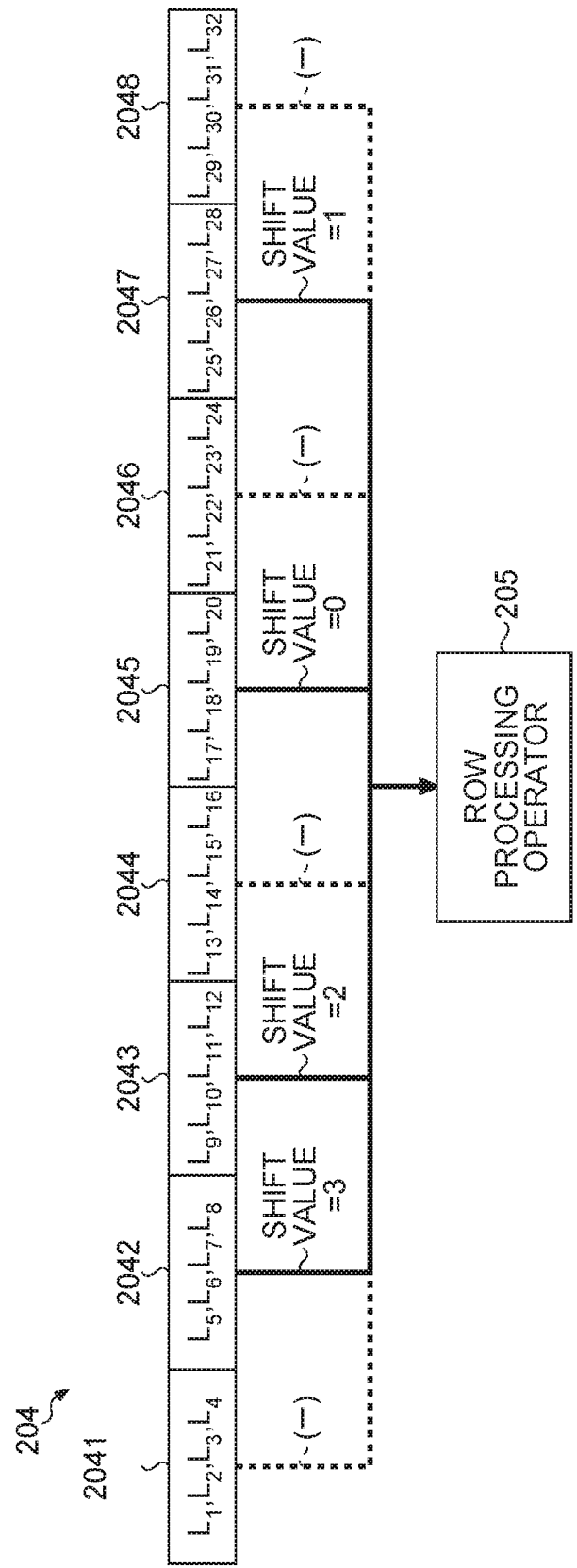
FIG. 10 is a view illustrating an LLR memory example illustrated in FIG. 9.

Herein, an example of the LLR memory 204 illustrated in FIG. 9 is illustrated in FIG. 10. The LLR memory 204 is a memory which stores the LLRs having the length of the code length. Therefore, in the LLR memory 204 which stores the check code 210, 32 LLRs are sectioned into eight LLR blocks 2041 to 2048 to be stored. The LLR blocks 2041 to 2048 are ordered with numbers (LLR block numbers) starting from one from left of the code 210, for example. The rows in the code 210 are ordered with numbers (row block numbers) starting from one from top of the code 210, for example. When row processing is executed, the LLR block required for the row processing is read from the LLR blocks of one row stored in the LLR memory 204 to be input to the row processing operator 205.

It is described with reference to FIG. 9 again. The check matrix manager 201 manages the LLR block number of the LLR block required in the row processing for each row and the shift value which characterizes each required LLR block. Correspondence relationship between the LLR block number and the shift value is managed in advance in the management table 207, for example. Then, the check matrix manager 201 inputs the row block number and specifies the LLR block number and the shift value associated with the input row block number from the management table 207. A group of the specified LLR block number and shift value is output to the LLR block number converter 202.

For example, when the check node processing is performed on the LLR block in the first row of the matrix, information of second, third, fifth, and seventh LLR blocks 2042, 2043, 2045, and 2047 and shift values 3, 2, 0, and 1 characterizing the LLR blocks, respectively, are required. Therefore, when the row block number (=1) of the LLR block in the first row is input, the check matrix manager 201 specifies the information of 2, 3, 5, and 7 as the LLR block numbers associated with the row block number and the information of 3, 2, 0, and 1 as the shift values characterizing the LLR blocks, respectively, from the management table 207 and outputs the specified information of the LLR block numbers (2, 3, 5, and 7) and shift values (3, 2, 0, and 1) to the LLR block number converter 202.

The LLR block number converter 202 corresponding to an interleaver 111 in the first embodiment is shared by an encoding device 10 and the decoding device 200 illustrated in FIG. 7. Therefore, at the time of encoding, the LLR block number converter 202 executes interleaving of the data LLR block in the code for creating the second parity being the shared parity.

On the other hand, at the time of decoding, the LLR block number converter 202 is turned off in the first-stage decoding and turned on in the second-stage decoding. In the second-stage decoding in which the LLR block number converter 202 is turned on, the order of the input LLR block numbers is changed with a rule determined in advance (for example, refer to FIG. 11 to be described later). According to this, an error position in a received word is changed, so that the decoding for an error pattern different from the error pattern which leads to decoding failure becomes possible. As a result, the error rate in the error-floor may be decreased.

Meanwhile, LLR block order random interleaving and LLR block cyclic shift interleaving are examples of a method of the interleaving by the LLR block number converter 202. In the LLR block order random interleaving, only the LLR block numbers are randomly changed without changing the order of the LLRs in each data LLR block. In the LLR block cyclic shift interleaving, the LLR block numbers are cyclically shifted by a method similar to that of the LLR block order interleaving. The two methods are simple and an effect of significantly decreasing the error rate in the error-floor may also be expected.

It is described with reference to FIG. 9 again. The LLR block number and the shift value after the interleaving output from the LLR block number converter 202 are input to the LLR memory I/O 203. The LLR memory I/O 203 converts the LLR block number to access information required for accessing the LLR memory 204. The access information may be a memory bank number or a word number of an SRAM when a non-volatile memory 9 (refer to FIG. 7) is the SRAM, for example.

The row processing operator 205 performs row processing operation on the LLR block by using the access information and the shift value received from the LLR memory I/O 203 and stores a result of the row processing in the row processing result memory 206.

Figures 11, 12:
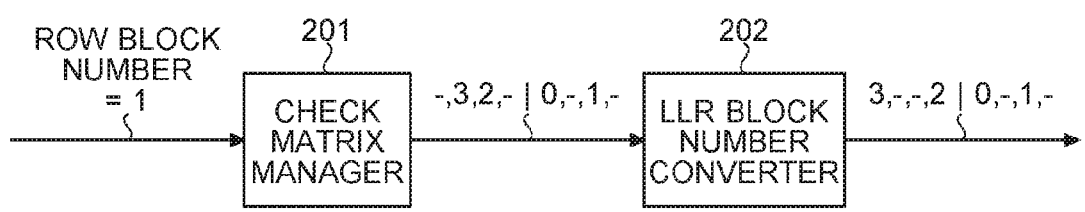
FIG. 11 is a view illustrating an example of a replacing role of an LLR block number converter according to the second embodiment.
FIG. 12 is a view illustrating an input to a check matrix manager and an output from the LLR block number converter in second-stage decoding according to the second embodiment.

Herein, the row processing on the check matrix 210 is described with a focus on a flow of the row processing on the LLR block in the first row of the check matrix 210. FIG. 11 is a view illustrating an example of a replacing rule of the LLR block number converter according to the second embodiment. FIG. 12 is a view illustrating an input to the check matrix manager and an output from the LLR block number converter in the second-stage decoding according to the second embodiment.

In a matrix illustrated in FIG. 11, an upper sequence represents the order of the LLR block numbers to be input and a lower sequence represents the order of the LLR block numbers to be output. In the replacing rule, the LLR block number input first is output second, the LLR block number input second is output first, the LLR block number input third is output fourth, and the LLR block number input fourth is output third. Therefore, as illustrated in FIG. 12, when the LLR block numbers and the shift values (-, 3, 2, -|0, -, 1, -) for the LLR blocks in the first row of the check matrix 210 illustrated in FIG. 8 are input to the LLR block number converter 202, the LLR block numbers and the shift values for the LLR blocks in the first row are output from the LLR block number converter 202 in the order of (3, -, -, 2|0, -, 1, -). Meanwhile, the replacing rule is the same as that of the interleaver 111 in the first embodiment.

Figure 13:
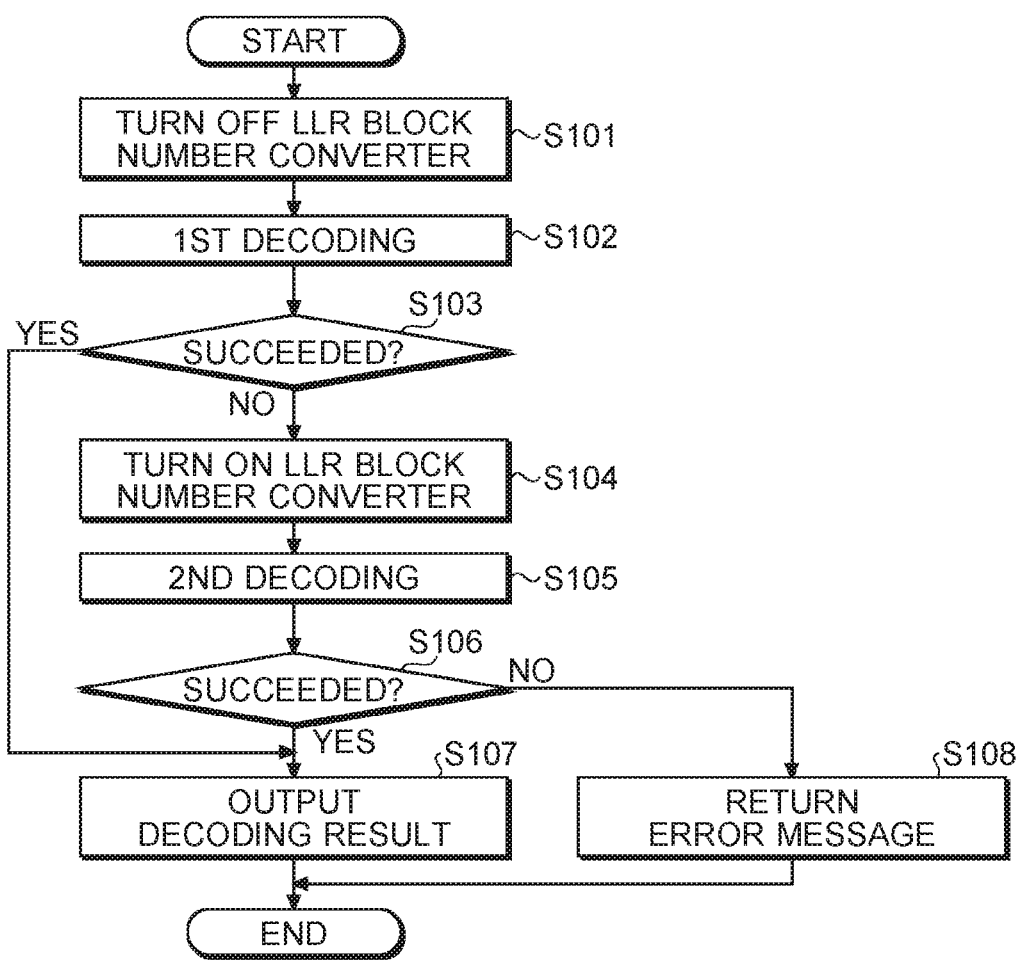
FIG. 13 is a flowchart illustrating an example of a flow of a decoding process in the second embodiment.

Subsequently, a flow of a decoding process in the second embodiment is described with reference to a flowchart illustrated in FIG. 13. In the decoding process in the second embodiment, as described above, the first-stage decoding to execute the decoding without interleaving the LLR block numbers is first executed, and when the decoding of at least one constituent code is unsuccessful as a result of the first-stage decoding, the second-stage decoding associated with the interleaving of the LLR block numbers is executed. Therefore, as illustrated in FIG. 13, in the decoding process in the second embodiment, the LLR block number converter 202 is first turned off (step S101), and the decoding (first-stage decoding) is executed in this state (step S102). In the state in which the LLR block number converter 202 is turned off, the LLR block numbers and the shift values input to the LLR block number converter 202 are directly output without changing the order and the decoding is executed. Meanwhile, turning on/off of the LLR block number converter 202 is controlled by a controller 3 illustrated in FIG. 7, for example.

When the first-stage decoding at step S102 is successful (step S103; YES), the decoding result obtained by the first-stage decoding is output (step S107) and this operation is finished. On the other hand, when the first-stage decoding at step S102 is unsuccessful (step S103; NO), the LLR block number converter 202 turned into a stopped state at step S101 is put into an operating state (step S104) and the decoding (second-stage decoding) is executed in this state (step S105). In the state in which the LLR block number converter 202 is stopped, the LLR block numbers and the shift values input to the LLR block number converter 202 are interleaved with the replacing rule illustrated in FIG. 11 and the decoding is executed by using the interleaved LLR block numbers and shift values. At that time, as described above, the decoding device 200 used in the second-stage decoding may be the same as the decoding device 200 used in the first-stage decoding.

Thereafter, when the second-stage decoding at step S105 is successful (step S106; YES), the decoding result obtained by the second-stage decoding is output (step S107) and this operation is finished. On the other hand, when the second-stage decoding at step S105 is unsuccessful (step S106; NO), an error message indicating decoding failure is returned (step S108) and this operation is finished.

As described above, according to the second embodiment, it becomes possible to reuse the decoding device 200 used in the first-stage decoding in the second-stage decoding, so that the complexity of the second-stage decoding may be decreased. Other configuration, operation and effect may be similar to those described in the first embodiment, so that the detailed description thereof is herein omitted.

Meanwhile, in the integrated parallel interleaved concatenation, decoding performance may be further improved by decoding by using the parity check matrix of a wider range according to the decoding algorithm. In the simplest generalization, a data LLR block group the decoding of which is unsuccessful, a corresponding parity LLR block group, and a shared parity LLR block group are simultaneously BP-decoded.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory; and
   a memory controller including
      an encoding device that encodes a plurality of user data to be written in the non-volatile memory, and
      a memory interface that writes a result of encoding by the encoding device in the non-volatile memory, wherein
   the encoding device includes
      a first encoder that encodes the plurality of user data, respectively, to generate respective first parities of the plurality of user data,
      a first interleaver that interleaves the plurality of user data, respectively, and
      a first XOR accumulator that executes bit-wise modulo-2 operation on the plurality of user data interleaved by the first interleaver,
   the first XOR accumulator including an XOR circuit and a buffer,
   the buffer storing a value output from the XOR circuit,
   the value in the buffer being sequentially updated with the value output from the XOR circuit,
   the plurality of user data interleaved by the first interleaver being sequentially inputted into the XOR circuit,
   the XOR circuit executing bit-wise modulo-2 operation by using the sequentially-inputted user data interleaved by the first interleaver and the value currently stored in the buffer,
   the first encoder encoding the value finally stored in the buffer, which is a result of the bit-wise modulo-2 operation by using the last user data in the plurality of user data interleaved by the first interleaver and the value currently stored in the buffer, to generate second parity,
   the memory interface writing a code word sequence including the plurality of user data, the first parities and the second parity in the non-volatile memory as the result of encoding.

2. The memory system according to claim 1, wherein the plurality of user data include at least first to third user data,
   the first interleaver interleaves the at least first to third user data, respectively, and the bit-wise modulo-2 operation executed by the first XOR accumulator includes a first bit-wise modulo-2 operation using first and second user data which are interleaved by the first interleaver, respectively, and second bit-wise modulo-2 operation using the third user data interleaved by the first interleaver and a result of the first bit-wise modulo-2 operation.

3. The memory system according to claim 1, wherein, when a code of the first encoder is a quasi-cyclic code constructed from a plurality of blocks, a one-block size cyclic shift interleaver is used as the first interleaver.

4. The memory system according to claim 1, wherein, when a code of the first encoder is a quasi-cyclic code constructed from a plurality of blocks, a block interleaver that changes order of the plurality of blocks while maintaining order of bits in each block is used as the first interleaver.

5. The memory system according to claim 1, wherein the first interleaver replaces the plurality of user data by a common first replacing rule.

6. The memory system according to claim 5, wherein the first interleaver is arranged on an output side of the first XOR accumulator.

7. The memory system according to claim 1, wherein the first encoder encodes the plurality of user data by using a common code.

8. The memory system according to claim 1, wherein
   the memory interface reads the code word sequence written in the non-volatile memory,
   the memory controller further includes a decoding device that decodes the read code word sequence, and
   the decoding device with includes
      a first decoder that decodes a plurality of user data included in the read code word sequence;
      a second interleaver that interleaves all the user data obtained by successful decoding by the first decoder as a result of the decoding by the first decoder by the same replacing rule as the replacing rule of the first interleaver;
      a second XOR accumulator that executes bit-wise modulo-2 addition on the result interleaved by the second interleaver;
      a second encoder that encodes a result output from the second XOR accumulator by using the same code as the code of the first encoder;
      a bipolar transformer that performs bit-wise binary-to-bipolar conversion on third parity obtained by encoding by the second encoder; and
      a multiplier that executes component-wise multiplication of a result of the bit-wise binary-to-bipolar conversion by the bipolar transformer by a log-likelihood ratio (LLR) of the read second parity, wherein
   the decoding device further includes:
      a third interleaver that interleaves the user data the decoding of which by the first decoder is failed by the same replacing rule as the replacing rule of the first interleaver when the decoding of one user data included in the code word sequence fails by the first decoder is failed;
      a second decoder that decodes the user data interleaved by the third interleaver and a result of the component-wise multiplication by the multiplier according to the same code as the code of the first encoder; and
      a first de-interleaver that executes de-interleaving by a replacing rule opposite to the replacing rule of the first interleaver on a result of the decoding by the second decoder.

9. The memory system according to claim 8, wherein the second encoder and the first encoder are the same encoders.

10. The memory system according to claim 8, wherein the first interleaver and the second interleaver are the same interleavers.

11. The memory system according to claim 8, wherein, the decoding device further includes:
a fourth interleaver that interleaves the user data the decoding of which by the first decoder is failed by the same replacing rule as the replacing rule of the first interleaver when the decoding of two or more user data included in the code word sequence by the first decoder is failed;
a third decoder that decodes the user data interleaved by the fourth interleaver and a result of the component-wise multiplication by the multiplier according to the same code as the code of the first encoder; and
a second de-interleaver that executes de-interleaving by a replacing rule opposite to the replacing rule of the first interleaver on a result of the decoding by the second decoder.

12. The memory system according to claim 8, wherein, the decoding device further includes:
a fourth decoder that decodes a result of bit-wise modulo-2 addition of two or more user data the decoding of which by the first decoder is failed and the result of the component-wise multiplication of the result of the bit-wise binary-to-bipolar conversion of the third parity by the read second parity according to the same code as the code of the first encoder and estimates an error vector based on a result of the decoding by the fourth decoder when the decoding of the two or more user data included in the code word sequence by the first decoder is failed and when the plurality of user data are interleaved by different replacing rules; and
a fifth decoder that, for respective user data the decoding of which by the first decoder is failed, executes de-interleaving by the replacing rule of the first interleaver on one of the user data the decoding of which by the first decoder is failed on the error vector obtained from the fourth decoder, executes bit-wise modulo-2 addition of a result of the de-interleaving and the code word the decoding of which fails, and performs the same decoding as the decoding of the first decoder on a result of the bit-wise modulo-2 addition.

13. The memory system according to claim 1, wherein
a code of the encoding device is a quasi-cyclic-LDPC code,
the first interleaver sequentially interleaves the plurality of user data in units of circulant matrix of the quasi-cyclic-LDPC code,
the memory interface reads the code word sequence and the second parity written in the non-volatile memory,
the memory controller further includes a decoding device that decodes the read code word sequence by using a belief propagation (BP) decoding algorithm, and
the decoding device includes:
an LLR memory that sections parity check matrix used by the first encoder for the decoding of the plurality of user data, respectively, into LLR blocks each of which is a circulant matrix unit to store;
a check matrix manager that outputs LLR block numbers of LLR blocks required in row processing on respective rows of the parity check matrix and shift values characterizing the LLR blocks required in the row processing, respectively;
an LLR block number converter that converts first order of the LLR block numbers output for the row processing of the respective rows from the check matrix manager to second order with the same replacing rule as the replacing rule of the first interleaver;
a row processing operator that executes row processing operation on the respective rows of the parity check matrix by using the shift values corresponding to the LLR block numbers according to the second order of the LLR block numbers interleaved by the LLR block number converter; and
a row processing operation result memory that stores a result of the row processing operation.

14. The memory system according to claim 13, further comprising:
a controller that switches an operating state of the LLR block number converter between an on state and an off state, wherein
when the operating state of the LLR block number converter is the off state, the LLR block number converter outputs the first order instead of the second order without the converting, and
the row processing operator executes the row processing operation on the respective rows of the parity check matrix by using the shift values corresponding to the LLR block numbers according to the second order of the LLR block numbers output from the LLR block number converter of which the operating state is the on state when the decoding of the code word sequence is unsuccessful as a result of executing the row processing operation on the respective rows of the parity check matrix by using the shift values corresponding to the LLR block numbers according to the first order of the LLR block numbers output from the LLR block number converter of which the operating state is the off state.

* * * * *